(12) United States Patent
Steegmüller et al.

(10) Patent No.: US 8,072,692 B2
(45) Date of Patent: Dec. 6, 2011

(54) LENS, LASER ARRANGEMENT AND METHOD FOR PRODUCING A LASER ARRANGEMENT

(75) Inventors: Ulrich Steegmüller, Regensburg (DE); Frank Singer, Regenstauf (DE); Guido Weiss, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 993 days.

(21) Appl. No.: 11/793,259

(22) PCT Filed: Dec. 12, 2005

(86) PCT No.: PCT/DE2005/002235
§ 371 (c)(1),
(2), (4) Date: Jan. 10, 2008

(87) PCT Pub. No.: WO2006/066543
PCT Pub. Date: Jun. 29, 2006

(65) Prior Publication Data
US 2011/0102914 A1    May 5, 2011

(30) Foreign Application Priority Data
Dec. 21, 2004 (DE) .......... 10 2004 061 576
Feb. 10, 2005 (DE) .......... 10 2005 006 052

(51) Int. Cl.
*G02B 13/18* (2006.01)
(52) U.S. Cl. .......... 359/718; 359/708; 359/719
(58) Field of Classification Search .......... 359/642, 359/708, 718, 719
See application file for complete search history.

(56) References Cited

U.S. PATENT DOCUMENTS

| | | | | |
|---|---|---|---|---|
| 4,185,891 | A | * | 1/1980 | Kaestner .......... 372/9 |
| 4,283,242 | A | * | 8/1981 | Regler et al. .......... 156/154 |
| 4,830,454 | A |   | 5/1989 | Karstensen |
| 5,022,733 | A |   | 6/1991 | Angenent et al. |
| 5,078,474 | A | * | 1/1992 | Marui et al. .......... 349/4 |
| 5,422,475 | A | * | 6/1995 | Norton .......... 250/216 |
| 5,705,025 | A |   | 1/1998 | Dietrich et al. |
| 5,757,830 | A |   | 5/1998 | Liau et al. |
| 5,940,564 | A | * | 8/1999 | Jewell .......... 385/93 |
| 5,963,577 | A |   | 10/1999 | Snyder et al. |
| 6,043,940 | A |   | 3/2000 | Kamiyama et al. |
| 6,434,297 | B1 |   | 8/2002 | Althaus et al. |
| 6,646,782 | B1 |   | 11/2003 | Russell et al. |
| 2001/0026658 | A1 |   | 10/2001 | Althaus et al. |

(Continued)

FOREIGN PATENT DOCUMENTS
DE      195 27 026 A      2/1997
(Continued)

OTHER PUBLICATIONS
English translation of Taiwanese Examination Report for the corresponding application No. 94145070.
(Continued)

*Primary Examiner* — Darryl J Collins
(74) *Attorney, Agent, or Firm* — Cozen O'Connor

(57) ABSTRACT

An aspherical planoconvex lens (20), containing a material with a refractive index of at least 3.0, in which the height (h) of the convex region (21) is a maximum of one fifth of the thickness (1) of the lens (20). Also disclosed is a laser assembly incorporating such a lens and a method for the manufacture of such a laser assembly.

21 Claims, 2 Drawing Sheets

U.S. PATENT DOCUMENTS

| | | |
|---|---|---|
| 2004/0251233 A1 | 12/2004 | Singer et al. |
| 2005/0168837 A1 | 8/2005 | Pawlowski et al. |
| 2008/0080068 A1* | 4/2008 | Maeno .......................... 359/811 |

FOREIGN PATENT DOCUMENTS

| | | |
|---|---|---|
| DE | 101 35 872 | 2/2003 |
| DE | 101 42 010 | 4/2003 |
| DE | 103 54 780 A1 | 6/2005 |
| EP | 0 706 070 | 9/1995 |
| EP | 1 018 053 | 7/2000 |
| EP | 1 460 456 A | 9/2004 |
| JP | 2-267511 | 11/1990 |
| JP | 2000-131501 | 5/2000 |
| JP | 2001-305308 | 10/2001 |
| JP | 2002-196233 | 7/2002 |
| JP | 2004-029474 | 1/2004 |
| TW | 434415 B | 5/2001 |
| TW | 588485 B | 5/2004 |
| WO | WO 97/04491 | 2/1997 |
| WO | WO 99/15926 | 4/1999 |

OTHER PUBLICATIONS

E. M. Strzelecka et al., "Fabrication of refractive microlenses in semiconductors by mask shape transfer in reactive ion etching", Microelectronic Engineering, Elsevier Publishers BV, vol. 35, No. 1, pp. 385-388, Feb. 1997.

K. J. McIntyre et al., "High-NA, Anamorphic or Aspheric Microlenses for Telecommunications and Data Storage", Trends in Optics and Photonics. Diffractive Optics and Micro-Optics Technical Digest, Postconference Edition, vol. 41, No. 18, pp. 278-280, Jun. 18, 2000.

S. Nemoto et al., "Transformation of Waist Parameters of a Gaussian Beam by a Thick Lens", Applied Optics, OSA, Optical Society of America, Washington, DC, vol. 29, No. 6, pp. 809-816, Feb. 20, 1990.

Z. L. Liau et al, "Simple Compact Diode-Laser/Microlens Packaging", IEEE Journal of Quantum Electronics, IEEE Service Center, Piscataway, NJ, vol. 33, No. 3, pp. 457-461, Mar. 1997.

Z.L. Liau et al., "Accurate Fabrication of Anamorphic Microlenses and Efficient Collimation of Tapered Unstable-Resonator Diode Laser", Applied Physics Letters, American Institute of Physics, Melville, NY, vol. 64, No. 25, pp. 3368-3370, Jun. 20, 1994.

* cited by examiner

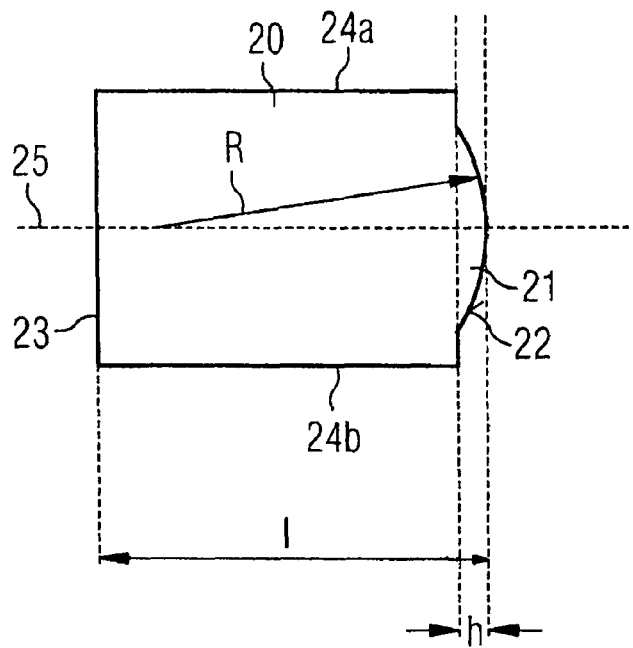
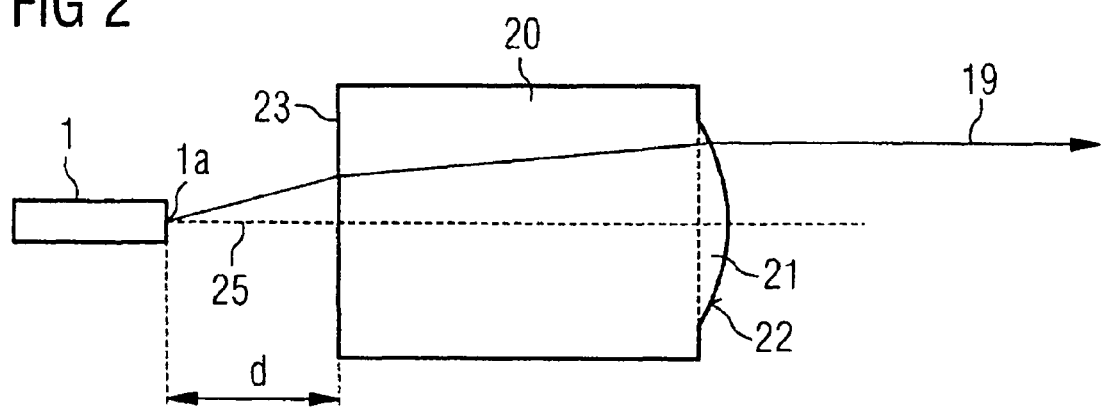

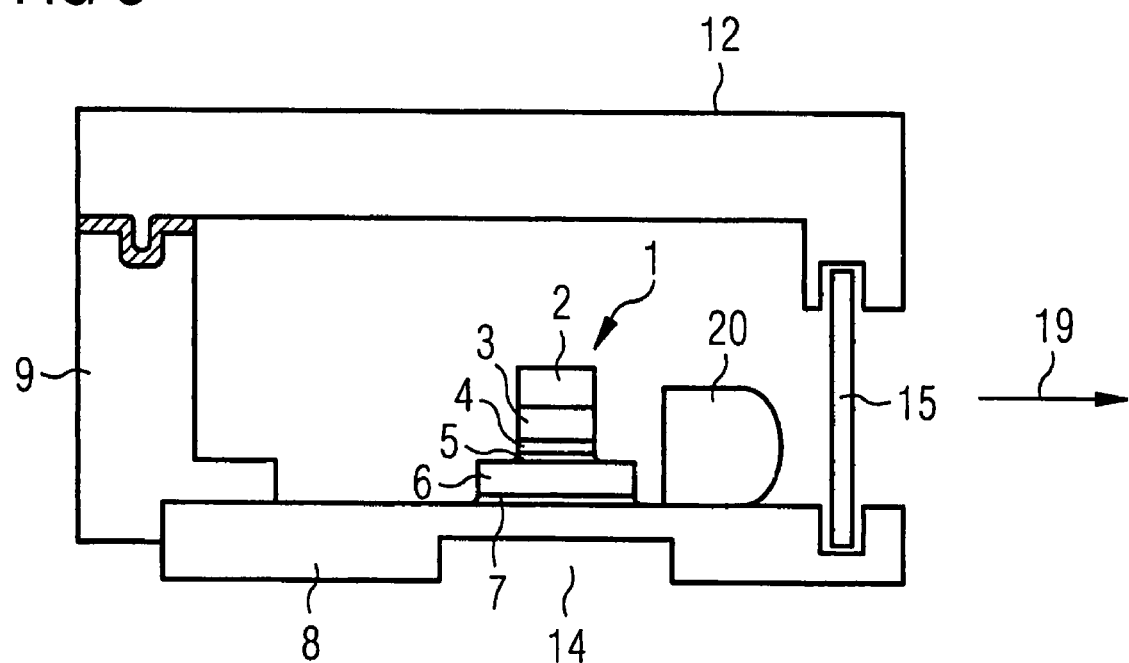

LENS, LASER ARRANGEMENT AND METHOD FOR PRODUCING A LASER ARRANGEMENT

RELATED APPLICATIONS

This is a U.S. national stage of application No. PCT/DE2005/002235, filed on Dec. 12, 2005.

This patent application claims the priority of German patent application no. 10 2004 061 576.4 filed Dec. 21, 2004 and 10 2005 006 052.8 filed Feb. 10, 2005, the disclosure content of which is hereby incorporated by reference.

FIELD OF THE INVENTION

The present invention concerns a lens. The invention moreover concerns a laser assembly and method for the manufacture of a laser assembly.

BACKGROUND OF THE INVENTION

Document U.S. Pat. No. 4,830,454 describes an optical lens.

SUMMARY OF THE INVENTION

It is an object of the present invention to provide a lens that can be used in particularly various ways. It is, moreover, another object of the present invention to provide a laser apparatus having such a lens and a method for the manufacture of a laser apparatus of this type.

A lens is disclosed.

According to at least one embodiment of the lens, the lens is a planoconvex lens, which means that the lens has at least one surface that is substantially plane. Substantially plane means here that the surface of the lens, apart from unavoidable unevenness resulting from the manufacturing process, is plane, and in particular that the surface does not have any regions with convex or concave curvature. Favourably, the plane surface of the lens is a surface where radiation enters.

The planoconvex lens, further, has at least one outer surface that has a region of convex curvature. It is possible here for the curved region to include the entire surface. This means that, in that case, the entire surface has convex curvature. It is also possible for the curved region to include only part of the surface, and for the remaining part of the surface to be, for instance, plane.

That part of the lens having the convex curvature has, for instance, spherical or aspherical curvature. Favourably, the curved region is located on that side of the lens that is opposite to the surface where radiation enters, and forms a radiation exit surface for the lens. This means that electromagnetic radiation favourably enters the lens through the plane surface. The radiation crosses the lens in a substantially straight line, in other words without being significantly scattered or refracted in the interior of the lens. The radiation emerges from the lens at the surface that includes the convex region.

It is, however, also possible for radiation to pass through the lens in the opposite direction, that is for radiation to enter the lens through the curved region, and to emerge from the lens at a plane surface.

According to at least one embodiment, the lens is an aspherical lens. This means that the lens has at least one region with aspherical curvature, i.e. a surface whose curvature is not part of the sphere. The curvature of the aspherically curved region can then be adapted to the requirements of the lens. In this way quantities such as, for instance, the numerical aperture or the collimation of the lens can be adjusted.

The aspherical surface can favourably be represented as a rotational asphere having been generated by rotating an axially symmetric curve. The axis here is, for instance, given by the optical axis of the lens. The curve is, for instance, given by the meridional curve, in other words by the intersection of the aspherical surface and the meridional plane. Favourably the rotational asphere can be represented in the following form:

$$y = \frac{x^2}{R\left(1 + \sqrt{1 - \frac{(1+c)x^2}{R^2}}\right)} + a_2 x^2 + a_4 x^4 + a_6 x^6 + \ldots$$

Here y is the axially symmetric curve, c is the aspherical factor, R is radius of curvature, while $a_2$, $a_4$, $a_6$ are higher-order coefficients. Favourably at least some of the higher-order coefficients are chosen to be unequal to zero. In this way, a particularly flat, aspherically curved region can be achieved, and the lens is then characterized by relatively low spherical aberration.

According to at least one embodiment of the lens, the lens is a planoconvex, aspherical lens. This means that the lens has, as described above, at least one plane surface and at least one surface that includes an aspherical region curved in a convex manner. These two lens surfaces are favourably located opposite one another. It is particularly favourable if the plane surface is the surface where radiation enters the lens, and the convex, aspherically curved region is the surface where radiation leaves the lens.

According to at least one embodiment, the lens contains a material with a refractive index greater than or equal to 2.0. Favourably the lens has this refractive index for electromagnetic radiation in the range of wavelengths between 800 and 950 nm at least.

According to at least one embodiment, the lens contains a material with a refractive index greater than or equal to 2.5. Favourably the lens has this refractive index for electromagnetic radiation in the range of wavelengths between 800 and 950 nm at least.

According to at least one embodiment, the lens contains a material with a refractive index greater than or equal to 3.0. The lens favourably includes material with a refractive index between 3.05 and 3.20. It is particularly favourable if the material has this refractive index for electromagnetic radiation in the range of wavelengths between 800 and 950 nm at least. The material favourably has a constant refractive index; in other words, the refractive index is not a function of the location.

According to at least one embodiment, the lens is a planoconvex lens in which the height of the convex region is at most ⅓ of the thickness of the lens. The thickness of the lens is defined by the distance from the vertex of the region of the lens having the convex curvature to the plane surface on the other side. Favourably, surfaces of the lens formed in a plane manner connect the plane surface to the surface of the lens that includes the convex region.

The height of the convex region here is preferably measured at the vertex of the convex region. It is particularly favourable if this vertex of the convex region lies on the optical axis of the lens. The height of the convex region is the distance from the vertex of the convex region to the plane in which the convex region intersects with the rest of the body of the lens.

According to at least one embodiment, the lens is a planoconvex lens in which the height of the convex region is at most ¼ of the thickness of the lens.

According to at least one embodiment, the lens is a planoconvex lens in which the height of the convex region is at most ⅕ of the thickness of the lens.

According to at least one embodiment of the lens, a planoconvex, aspherical lens is thus given, containing a material with a refractive index of at least 3.0, in which the height of the convex region is at most ⅕ of the thickness of the lens.

According to at least one embodiment, the height of the convex region is at most ⅛ of the thickness of the lens.

According to at least one embodiment, the height of the convex region is at most 60 µm. Favourably the height of the region of the lens with convex curvature is between 35 and 60 µm.

According to at least one embodiment of the lens, the thickness of the lens, i.e., for instance, the distance between the plane surface where radiation enters the lens and the vertex of the convex region, is at most 500 µm. Preferably, the thickness of the lens is between 300 and 500 µm. It is particularly favourable for the thickness of the lens to be between 425 and 475 µm.

In at least one embodiment of the lens, the lens contains a semiconductor material. Favourably, the semiconductor material has a refractive index of at least 3.0. It is particularly favourable if the semiconductor material has this refractive index for electromagnetic radiation in the range of wavelengths between 800 and 950 nm. It is, for instance, possible for the body of the lens to consist entirely of semiconductor material. At least one part of the surface of the lens can, then, for instance, be coated with another material.

According to at least one embodiment of the lens, the lens contains GaP or another semiconductor material based on GaP such as InGaP or InGaAlP. It is, for instance, possible for the body of the lens to consist entirely of GaP or of a semiconductor material based on GaP.

According to at least one embodiment of the lens, the value of the radius of curvature R of the region having convex curvature is at least 400 µm, preferably at least 450 µm. It is particularly favourable if the radius of curvature of the convex region of the lens is between 400 and 500 µm.

According to at least one embodiment of the lens, the numerical aperture of the lens is at least 0.7. Favourably, the numerical aperture of the lens is at least 0.8, and it is particularly favourable if it is at least 0.85. It is favourable for the numerical aperture of the lens to be chosen to be as large as possible. It is particularly favourable for the numerical aperture of the lens to be larger than or equal to the numerical aperture of the source of radiation with which electromagnetic radiation is being introduced into the lens.

According to at least one embodiment of the lens, the surface through which radiation enters the lens, or the surface through which radiation leaves the lens has an antireflection coating. Favourably, both the surface where radiation enters the lens and the surface where radiation leaves the lens have antireflection coating.

The antireflection coating may, for instance, be a coating of a single layer. The thickness of the layer can, for instance, be adapted to the wavelength with which a specifiable source of radiation generates the radiation that passes through the lens. The layer can favourably contain $SiN_xO_y$.

It is, further, possible for the antireflection coating to incorporate a number of layers on top of one another. A first layer can, for instance, contain TaO while a second layer contains AlO, or the layers may in fact consist of these materials.

A laser assembly is also disclosed.

According to at least one embodiment of the laser assembly, the laser assembly incorporates a semiconductor chip that is suitable for generating electromagnetic radiation. Favourably, a lens, suitable for reducing the divergence of the radiation emitted by the semiconductor chip, is arranged downstream in the direction of radiation with respect to the semiconductor chip.

The lens here favourably follows the semiconductor chip in such a way that at least part of the electromagnetic radiation generated when the semiconductor chip is operating, and that leaves the semiconductor chip through a radiation outcoupling surface of the semiconductor chip, enters the lens through a plane radiation entry surface. It is particularly favourable if the lens is a planoconvex lens according to at least one of the embodiments described above.

The radiation favourably leaves the lens through a convex region on the surface of the lens that lies opposite the radiation entry surface. After passing through the lens, the electromagnetic radiation advantageously demonstrates lower divergence than prior to its entry into the lens.

According to at least one embodiment of the laser assembly, the distance between the surface of the semiconductor chip that couples the radiation out and the surface of the lens where radiation enters the lens is a maximum of 80 µm. Favourably the distance is a maximum of 75 µm; particularly favourably the maximum is 50 µm.

According to at least one embodiment of the laser assembly, the semiconductor chip corresponds to one of the following components: a light-emitting diode chip, laser bar, semiconductor laser chip. Preferably, the semiconductor chip is suitable for generating laser radiation in a range of wavelengths between 800 and 950 nm. It is particularly favourable if the semiconductor chip can generate laser radiation continuously (cw mode). The power consumption of the semiconductor chip is favourably at least 20 W.

According to at least one embodiment, the semiconductor chip and the lens are mounted on a common carrier. The semiconductor chip and the lens are, for instance, mounted on a lead frame.

According to at least one embodiment of the laser assembly, the lens is fastened to the carrier by an adhesive. This can, for instance, be a temperature-resistant adhesive. The adhesive is, for instance, located between the lead frame and a plane surface of the lens that is oriented perpendicular to the plane surface where radiation enters the lens.

In at least one embodiment of the laser assembly, the semiconductor chip is fastened to the lead frame by a hard solder joint, i.e. the semiconductor chip is favourably soldered to the lead frame by means of hard solder. It is, however, also possible for the semiconductor chip to be soldered to a thermally conductive element by means of hard solder, and for the thermally conductive element also to be soldered to the lead frame by means, for instance, of a hard solder joint.

The hard solder can, for instance, contain AuSn. The hard solder favourably has a melting point of 280° C. or more.

A method for the manufacture of a laser assembly is also disclosed. A laser assembly can, for instance, be manufactured according to one of the embodiments described above by means of this method.

In this method it is favourable for a lens to be placed within the optical path of the semiconductor chip using suction tweezers. The lens has, for instance, a thickness of at most 600 µm.

Favourably, the lens has at least two plane surfaces, opposite one another, oriented in parallel with the optical axis of the lens and perpendicular to a plane surface through which radiation enters the lens. For example, the two plane surfaces join the surface through which radiation enters the lens to the surface of the lens that incorporates a convex region through which radiation leaves the lens.

Favourably, the length of the two plane surfaces that are oriented along the optical axis is at least 350 μm, and it is particularly favourable for it to be at least 390 μm. The lens here can, for instance, be a lens according to at least one of the two embodiments described above.

Favourably, the suction tweezers pick up the lens for the purpose of assembly by one of the two plane surfaces, and places the lens with the opposite plane surface on a carrier. A means of bonding, such as an adhesive, can be located here between the carrier and the lens in order to fasten the lens.

The lens described here, and the laser assembly described here, are explained in more detail below with the aid of examples of their embodiment and of the associated figures.

In the examples of embodiment and the figures, elements that are identical or that have the same effect are given the same reference codes. The elements illustrated are not to scale. For the sake of understanding, some elements have been shown disproportionately large.

BRIEF DESCRIPTION OF THE DRAWINGS

FIG. 1 shows a schematic sectional view of one embodiment of the lens described here.

FIG. 2 shows a schematic sectional view of a first embodiment of the laser assembly described here.

FIG. 3 shows a schematic sectional view of a further embodiment of the laser assembly described here.

DETAILED DESCRIPTION OF THE DRAWINGS

The lens 20 has, for instance, a radiation entry surface 23. Located opposite the radiation entry surface 23 is a region 21 having convex curvature and with a height h. The convex region can extend over the whole of the surface opposite the radiation entry surface 23. It is also, however, possible for the convex region, as shown in FIG. 1, to occupy only part of the surface.

The convex region 21 is terminated by the aspherical surface 22 that forms the radiation exit surface of the lens. The distance between the radiation entry surface 23 and the vertex of the aspherical, convex surface 22 is referred to as the thickness l of the lens. The vertex of the curved surface may for instance here be located on the optical axis 25 of the lens.

The radiation entry surface 23 and the surface of the lens 20 that comprises the convex region 21 are connected by plane side surfaces 24a and 24b. One of these side surfaces, for instance side surface 24b, serves as a mounting surface for the lens, with which the lens can, for instance, be fastened to a carrier. The opposing side surface 24a can, for instance, be used when assembling the lens 20 as a suction surface for the suction tweezers.

The lens 20 contains, for instance, GaP or a semiconductor material based on GaP such as, for example, InGaP or InGaAlP. The lens can either contain one of these materials or can consist of one of these materials. GaP, for instance, has a refractive index of between about 3.10 and 3.14 for electromagnetic radiation in the range of wavelengths from about 800 to 950 nm.

An antireflection coating (not illustrated) may, for instance, be applied to the radiation entry surface 23 and the aspherical surface 22 (not illustrated). The antireflection coating can, for instance, be adapted to the wavelength of the electromagnetic radiation for which the lens is intended. The antireflection coating can, for instance, be applied as a single layer containing, for example $SiN_xO_y$. It is also possible for the antireflection coating to be formed from a sequence of a number of layers. The antireflection coating can, for instance, contain a layer that contains TaO and a further layer that contains AlO. Favourably the antireflection coating can be applied by vapour de-position to the surface of the lens when still in the wafer.

The manufacture of the lens 20 can, for instance, be carried out by etching the lens structure onto the wafer followed by separation into individual lenses, for instance by sawing.

The shaping of the aspherical surface 22 of the lens 20 can be achieved in accordance with the disclosure in DE 101 42 010, the subject matter of which is hereby incorporated by reference.

To create the aspherical surface 22 a photo-resist is, for instance, first applied to a lens substrate. The photo-resist is then structured to create a lens of photo-resist. The structure of the photo-resist lens can then be transferred, at least in part, to the lens substrate underneath by means of an anisotropic etching procedure such as reactive ion etching.

Etching procedures such as anode-coupled plasma etching in a parallel plate reactor, triode-reactive ion etching, inductively coupled plasma etching or similar processes are also suitable. The manufacturing procedure used favourably involves a number of gas components having different selectivity with respect to the photo-resist layer and the lens substrate. The selectivity refers here to the ratio between the etching rates of the lens substrate and the etching rate of the photo-resist. With a selectivity of 1, the shape of the resist-lens would largely be transferred unchanged to the lens substrate. The selectivity of >1, in contrast, leads to an additional rise in the etched semiconductor lens in comparison with the photo-resist lens. The selectivity of the etching procedure therefore, together with the initial shape of the resist lens, determines the shape of the lens 20 that is fabricated.

The shape of the aspherical surface 22 of the lens 20 is here, as described further above, described by the rotational asphere in an axially symmetric curve y, with $$y = \frac{x^2}{R\left(1 + \sqrt{1 - \frac{(1+c)x^2}{R^2}}\right)} + a_2 x^2 + a_4 x^4 + a_6 x^6 + \ldots$$

Depending on the selection of the lens parameters such as the radius of curvature R, the aspherical factor c, higher order coefficients, the lens thickness l and the height h of the convex region 21, it is possible to manufacture a planoconvex aspherical lens 20 with the desired collimation and the desired numerical aperture.

The properties of the lens 20 are adapted to match the requirements for use of the lens 20 in, for instance, a laser assembly, as is illustrated in a first embodiment shown in FIG. 2. The surface 1a through which radiation is coupled out of the semiconductor chip 1 that generates the radiation is located at a working distance d from the surface 23 through which radiation enters the lens 20. The lens 20 is suited to reduce the divergence of the electromagnetic radiation generated by the semiconductor chip. To this end, the electromagnetic radiation 19 is refracted towards the optical axis 25 of the lens 20 as soon as it enters through the radiation entry surface 23. When the radiation exits through the aspherical surface 22, a further refraction towards the optical axis takes place. The numerical aperture of the semiconductor chip is, for instance, between 0.75 and 0.85, and is preferably 0.8.

In one embodiment of the laser assembly having a lens thickness of approximately 450 µm, the working distance between the semiconductor chip and the lens is chosen to be 75 µm. A numerical aperture of approximately 0.82 can, for instance, be achieved by selecting a radius of curvature R=−454 µm and an aspherical factor c=−2.539. The height h of the curved region of the lens 20 in this case is 50 µm. Further, higher orders of the lens parameters here are equal to zero.

Other, higher orders of the lens parameters can, however, be taken into account. With the same working distance of d=75 µm and an unchanged lens thickness l of 450 µm, then with the parameters set to R=−465 µm, c=−1.772, $a_2$=0, $a_4$=−0.025 and $a_6$=10.106, a numerical aperture of 0.82 is achieved with a height of 49 µm for the height h of the curved region 21. In this embodiment, the lens is thus somewhat flatter. Towards the outside, i.e. moving away from the optical axis, the lens is straighter than in the first embodiment. The lens is also characterized by a lower spherical aberration.

In a further embodiment of the laser assembly, a working distance of d=50 µm is selected for a lens thickness of 450 µm. If the parameters R=−403 µm and c=−2.084 are selected, a numerical aperture of 0.89 can be achieved, in which case the height h of the convex region 21 is 56 µm.

If higher orders are added, then with the same lens thickness l=450 µm and the same working distance d=50 µm, a height h of 55 µm can be achieved with a numerical aperture of 0.89, where the parameters R=−413 µm, c=−1.372, $a_2$=0, $a_4$=−0.025 and $a_6$=25.803 are chosen. The lens is also then characterized by lower spherical aberration.

The error resulting from the manufacturing process in all of these embodiments is a maximum of 2% for the lens thickness, and has a maximum of between 5% and 10% for the lens shape (R, c and other shape of parameters).

FIG. 3 shows a further embodiment of the laser assembly.

The laser assembly incorporates a semiconductor chip 1, which, for example, corresponds to a laser diode chip or a laser bar. The semiconductor chip favourably contains at least one III-V semiconductor material comprising $In_xGa_yAl_{1-x-y}P$, $In_xGa_yAl_{1-x-y}N$ or $In_xGa_yAl_{1-x-y}As$, where in all cases $0 \leq x \leq 1$, $0 \leq y \leq 1$ und $x+y \leq 1$. The semiconductor chip 1 may, for instance, be suitable for the continuous generation of laser radiation. The wavelength of the laser radiation generated can, for instance, be between 800 and 950 nm. The semiconductor chip may, for instance, when generating radiation, consume at least a power of at least 20 W.

The semiconductor chip 1 comprises a sequence of semiconductor layers 3 located on a substrate 2, and includes at least one active zone 4 that generates radiation. The active zone can incorporate, for example, a pn junction, a double heterostructure, a single quantum well or, particularly favourably, a multiple quantum well (MQW) structure.

In the context of the application, the term "quantum well structure" refers to any structure in which charge carriers experience a quantization of its energy states as a result of confinement. In particular, the term "quantum well structure" says nothing about the dimensionality of the quantization. It therefore includes, among other things, quantum wells, quantum wires, quantum dots and any combination of these structures.

In the embodiment of the laser assembly illustrated in FIG. 3, the semiconductor chip 1 is fastened to a thermally conductive element 6 that can, for instance, contain CuW. The semiconductor chip may, for instance, be fastened to the thermally conductive element using an upside-down assembly method. The thermally conductive element 6 conducts the heat generated when the semiconductor chip 1 is operating away to the lead frame 8.

The coefficient of thermal expansion of the thermally conductive element 6 is favourably matched to the coefficient of thermal expansion of the semiconductor chip 1.

The semiconductor chip 1 can, for instance, be fastened by solder 5 to the thermally conductive element 6. The thermally conductive element 6 can, in turn, be attached by a solder joint 7 to the lead frame 8. Favourably, the solder joints 5, 7 consist of a hard solder such as AuSn. The lead frame 8 can, for instance, contain a thermally conductive material such as Cu. In addition, a further cooling structure 14, incorporating, for instance, cooling fins or a cooling channel, can be positioned on the underside of the lead frame 8, i.e. on the side that faces away from the semiconductor chip 1.

A housing part 9 is moulded to the lead frame 8, containing a plastic such as PEEK (polyetheretherketone) or a temperature-resistant LCP (liquid crystal polymer). Favourably, the housing part 9 is moulded to the lead frame 8 before the semiconductor chip is fastened to the lead frame 8. The housing part 9 favourably surrounds at least part of the lead frame 8. The housing part 9 can, for instance, be manufactured by injection moulding, transfer moulding or through a pressure casting process.

A housing cover 12 can be mounted on the housing part 9. Favourably the housing cover 12 contains the same material as the housing part 9, and is attached to the lead frame 8 after mounting the semiconductor chip 1 and the lens 20.

The lens 20 can be glued to the lead frame 8, in which case the adhesive is located between the plane surface 24b and the lead frame 8. The lens 20 is, for instance, placed on the lead frame 8 by means of suction tweezers that lift it using the plane surface 24a; it is positioned, that is to say adjusted relative to the semiconductor chip 1, and fastened. A temperature-resistant, UV-hardening adhesive can be used to attach it. The electromagnetic radiation 19 generated by the semiconductor chip 1 passes first through the lens 20, and from there leaves the laser assembly through a window layer 15 that is at least partially radiation transmitting.

Favourable dimensions for the laser assembly here are a height between 2 mm and 4 mm, preferably 3 mm, for the width between 8 mm and 12 mm, preferably 10 mm, and for the depth between 8 mm and 12 mm, preferably 10 mm. The laser assembly favourably also features 10×10 pins for electrical connection.

The invention is not restricted to the description that refers to the example embodiments. The invention, rather, comprises every new feature and every combination of features, and in particular any combination of features in the patent claims, even if this feature or this combination itself is not explicitly described in the patent claims or in the example embodiments.

The invention claimed is:

1. An aspherical planoconvex lens, containing a material with a refractive index of at least 3.0, in which the height of the convex region is a maximum of one fifth of the thickness of the lens.

2. A lens according to claim 1, where the height of the convex region is a maximum of one eighth of the thickness of the lens.

3. A lens according to claim 1, where the height of the convex region is between 35 and 60 µm.

4. A lens according to claim 1, in which the thickness of the lens is between 300 and 500 µm.

5. A lens according to claim 1, in which the material includes a semiconductor material.

6. A lens according to claim 5, in which the material includes GaP.

7. A lens according to claim 1, in which the magnitude of the radius of curvature of the convex region is at least 400 μm.

8. A lens according to claim 1, in which the numerical aperture is at least 0.7.

9. A lens according to claim 1, in which at least one radiation entry surface and one radiation exit surface have an antireflection coating.

10. A lens according to claim 9, in which the antireflection coating contains at least one of the following materials: SiNO, TaO, AlO.

11. A laser assembly, having a semiconductor chip suitable for generating electromagnetic radiation, towards which the plane radiation entry surface of a planoconvex lens according to claim 1 faces in the direction in which radiation is emitted.

12. A laser assembly according to claim 11, in which the distance between the surface at which radiation is coupled out of the semiconductor chip and the surface where radiation enters the lens is a maximum of 80 μm.

13. A laser assembly according to claim 11, in which the semiconductor chip is one of the following components: a laser diode chip, laser diode bar.

14. A laser assembly according to claim 11, in which the semiconductor chip is suitable for generating electromagnetic radiation at a wavelength in the range between 800 and 950 nm.

15. A laser assembly according to claim 11, in which the lens is fastened to a lead frame by means of adhesive.

16. A laser assembly according to claim 15, in which the semiconductor chip is fastened to the lead frame by means of a hard solder joint.

17. A method for the manufacture of a laser assembly according to claim 11, in which a lens is placed within the optical path of a semiconductor chip by means of suction tweezers.

18. A method according to claim 17, in which the lens is a planoconvex lens.

19. A method according to claim 17, in which the thickness of the lens is a maximum of 600 μm.

20. A method according to claim 18, in which the suction tweezers lift the lens on a plane surface, and the lens is placed with a plane surface on the opposite side of the lens onto a carrier.

21. A method according to claim 20, in which the lens has two plane surfaces on opposite sides that have a length of at least 350 μm in the direction of the optical axis of the lens.

* * * * *